United States Patent [19]

Hedrick et al.

[11] Patent Number: 5,804,607
[45] Date of Patent: Sep. 8, 1998

[54] PROCESS FOR MAKING A FOAMED ELASTOMERIC POLYMER

[75] Inventors: Jeffrey Curtis Hedrick, Park Ridge, N.J.; James Lupton Hedrick, Pleasanton, Calif.; Jons Gunnar Hilborn, Sulpice, Switzerland; Yun-Hsin Liao, Tempe, Ariz.; Robert Dennis Miller, San Jose, Calif.; Da-Yuan Shih, Poughkeepsie, N.Y.

[73] Assignee: International Business Machines Corporation, Armonk, N.Y.

[21] Appl. No.: 951,824

[22] Filed: Oct. 16, 1997

Related U.S. Application Data

[63] Continuation-in-part of Ser. No. 620,059, Mar. 21, 1996, Pat. No. 5,726,211.

[51] Int. Cl.⁶ .................................................. C08J 9/26
[52] U.S. Cl. ............................... 521/64; 521/61; 521/63; 521/113; 521/117; 521/183; 521/184
[58] Field of Search .................. 521/61, 63, 64, 521/113, 117, 183, 184

[56] References Cited

U.S. PATENT DOCUMENTS

| | | | |
|---|---|---|---|
| 3,054,761 | 9/1962 | Moore et al. | |
| 3,547,839 | 12/1970 | Tocker. | |
| 4,330,593 | 5/1982 | Shrout et al. | 428/407 |
| 4,418,157 | 11/1983 | Modic | 521/82 |
| 4,851,452 | 7/1989 | Gross et al. | 521/134 |
| 4,985,468 | 1/1991 | Elmes et al. | 521/63 |
| 5,116,883 | 5/1992 | LeMay | 521/178 |
| 5,252,620 | 10/1993 | Elliott, Jr. et al. | 521/64 |
| 5,306,733 | 4/1994 | Adamski et al. | 521/61 |
| 5,362,761 | 11/1994 | Usagami et al. | 521/64 |
| 5,420,168 | 5/1995 | Mayer et al. | 521/64 |
| 5,422,377 | 6/1995 | Aubert | 521/64 |
| 5,441,690 | 8/1995 | Ayala-Esquilin et al. | 264/277 |
| 5,444,097 | 8/1995 | Tkacik | 521/61 |

FOREIGN PATENT DOCUMENTS

0593966A1  4/1993  European Pat. Off..

OTHER PUBLICATIONS

W. R. Even Jr. et al., Emulsion–Derived Foams: Preparation, Properties, and Applications, MRS Bulletin (Apr. 1994).

C. L. Jackson et al., "The Linear Elastic Properties of Microcellular Foams", Polymer, (1991) vol. 32, No. 2.

*Primary Examiner*—John M. Cooney, Jr.
*Attorney, Agent, or Firm*—Robert B. Martin

[57] ABSTRACT

The present invention relates to a process for forming a foamed elastomeric polymer. The process involves forming a reverse emulsion of liquid droplets in a continuous liquid phase of polymer precursor and then polymerizing the precursor to entrap uniformly distributed droplets of the liquid in pores formed in the polymer bulk. The liquid in the pores is then removed under supercritical conditions.

8 Claims, No Drawings

PROCESS FOR MAKING A FOAMED ELASTOMERIC POLYMER

RELATED APPLICATION

This is a continuation-in-part of U.S. patent application, Ser. No. 08/620,059, filed Mar. 21, 1996 which is now U.S. Pat. No. 5,726,211.

FIELD OF THE INVENTION

The present invention relates to a process for making a foamed elastomeric polymer for use as a dielectric in electronic components.

BACKGROUND OF THE INVENTION

There is a continuing desire in the electronics industry to increase the circuit density in electronic components, e.g., circuit boards, multichip module chip test devices, and the like without degrading electrical performance (e.g., crosstalk) and also to increase the speed of signal propagation in these components. One method of accomplishing these goals is to reduce the dielectric constant of the polymeric insulator used in the components. A method for reducing the dielectric constant of a polymeric insulator is to foam the polymer with very small, uniformly dispersed air-filled pores.

Polymeric foams are well known in the art. One prior art process of making polymeric foams involves dispersing thermally decomposable particles in the monomer reaction mixture. The mixture is then heated to cause simultaneous polymerization and thermal decomposition of the particles to form a gas. The gas expands to form pores in the polymer resin. Unfortunately, the process results in nonuniform pore sizes and nonuniform distribution of pores throughout the bulk.

Another process was disclosed by Even et al., in the Material Research Society Bulletin, April 1994. Even discloses an emulsion process for forming foams of polystyrenes. The process involves forming an emulsion of water droplets in a continuous styrene monomer phase and then polymerizing the monomer to form a continuous bulk of thermoset polymer with dispersed water droplets. The water is then removed by heating to form the foam. Unfortunately, the Even process is not suitable for forming elastomeric polymeric foams because during the heating step, the pores collapse with the removal of the water which draws the elastic walls of the pores permanently closed.

It is therefore an object of the present invention to provide an improved process for making a foamed elastomeric polymer suitable for use in electronic devices.

Other objects and advantages will become apparent from the following disclosure.

SUMMARY OF THE INVENTION

The present invention relates to a process for forming a foamed polymer. The process involves (a) forming a reverse emulsion of liquid droplets in a continuous liquid phase of polymer precursor; (b) polymerizing the precursor to entrap uniformly distributed droplets of the liquid which form the corresponding pores in the polymer bulk; (c) heating the polymer under pressure in the presence of a gas to conditions near or above the critical temperature and critical pressure of the liquid in the pores to thereby exchange the liquid entrapped in the pores with the gas. Optionally, the polymer of step (b) can be first contacted with an organic solvent to exchange the liquid in the polymer pores with an organic solvent. Preferably the process relates to forming foamed elastomeric polymers such as polysiloxane. The foamed polymer made by the process of the invention has uniformly dispersed pores having uniform pore sizes with pore sizes preferably ranging from about 1 to 8 microns.

A more thorough disclosure of the present invention is presented in the detailed description.

DETAILED DESCRIPTION OF THE INVENTION

The present invention relates to a process for forming a foamed polymer. Preferably, the process involves four steps.

The first step involves forming a reverse emulsion of a discontinuous phase of liquid droplets in a continuous liquid phase of polymer precursor. Suitable polymer precursors include monomers and oligomers. A variety of foamed polymers can be made by the process of the present invention. Suitable polymers formed in the process of the present invention include polyurethane, polysiloxane, polybutadiene, polymethacrylate, polyimide, polybenzoxazole, polysilsesquioxane and poly(benzoxazole-co-silsesquioxane).

A preferred elastomeric polymer is polysiloxane (e.g., polydimethyl-co-diphenyl siloxane) such as disclosed in U.S. Pat. No. 5,441,690, the disclosure of which is incorporated herein by reference. Suitable precursors for polysiloxane are siloxane monomers or oligomers with reactive end groups. Suitable reactive end groups are vinyl, hydroxy, alkynyl and acetoxy.

Suitable liquids for forming the liquid droplets in the emulsion include polar liquids such as water, $C_{1-6}$ alcohols (e.g., ethanol, isopropanol) and $C_{3-6}$ ketones (e.g., acetone). Other suitable liquids will be known to those skilled in the art.

Preferably, the emulsion mixture contains a surfactant to reduce interfacial tension. A suitable surfactant for forming polysiloxane foams is the block copolymer of ethylene oxide-dimethylsiloxane. Other suitable surfactants include ionic and nonionic surfactants.

Other polymeric additive may also be added to the emulsion mixture such as fillers (e.g., inorganic fillers such as zinc oxide).

The emulsion can be formed by art known methods such as mixing the components in a high speed blender or mixer or ultrasonic mixer. The emulsion is stable and injection moldable.

The second step involves polymerizing the precursors. Preferred precursors for polysiloxane are vinyl terminated siloxane oligomers. For polysiloxane foams, polymerization is suitably initiated by hydrosilation with platinum catalyst at an elevated temperature. Polymerization results in the formation of crosslinked polysiloxane. The discontinuous phase of tiny droplets of the polar liquid forms uniformly dispersed pores throughout the polymer bulk having uniform pore size.

The third step of the preferred process of the present invention involves contacting the polymer bulk formed in step two with an organic solvent to exchange the entrapped polar liquid with the organic solvent. Suitable organic solvents include $C_{1-6}$ alcohols (methanol, ethanol, isopropanol), $C_{3-6}$ ketones (acetone) and $C_{5-10}$ alkanes (hexane). Suitable organic solvents will suitably be miscible with the liquid already in the pores and nonswelling in the polymer matrix. The preferred organic solvent is acetone. Conveniently, the polymer bulk is soaked in the organic solvent for a period of time of e.g., 2 hours in a sohxlet extractor.

The last step of the process of the present invention involves heating the polymer bulk under pressure with a gas to a temperature and pressure near or above the critical temperature and critical pressure of the fluid in the pores. Under these atmospheric conditions, the fluid in the pores becomes a critical fluid. A critical fluid, as used herein, is a substance heated to a temperature near or above its critical temperature $T_c$ and compressed to a pressure near or above its critical pressure $P_c$ to achieve miscibility with no phase separation. As used herein, a temperature near or above the $T_c$ will be a temperature greater than about 15° C. below the $T_c$. As used herein, a pressure near or above $P_c$ will be a pressure greater than about 1 atmosphere below the $P_c$. Preferably, the critical fluid is at or above the $T_c$ and at or above the $P_c$ e.g., a supercritical fluid. At its critical temperature and pressure, the organic fluid can be removed from the polymer bulk without causing collapse of the pores formed in the polymer. Step four can be accomplished by placing the bulk polymer in an enclosed pressure vessel with a gas and heating the vessel under pressure to conditions near or above the $T_c$ and $P_c$ of the organic liquid in the pores.

Suitable gases include air, nitrogen and argon. After the gas has exchanged out the critical fluid in the pores, heating is discontinued and the temperature and pressure are slowly lowered to ambient.

The foamed polymer formed by the process of the present invention has uniformly distributed pores throughout the bulk of the polymer preferably on the order of 1–2 micron. Further, the pore size can be adjusted (from submicron to about 30 microns) by varying the surfactant, stirring speed and cure rate. The polymer has low stress, low dielectric constant, improved toughness and improved compliance during mechanical contacting to require less contact force during compression. The polymer made by the process of the present invention is suitable for use in electronic devices including an integrated circuit chip test probe and pinless connector for packaging.

The following examples are a detailed description of the process of the invention. The detailed description falls within the scope of, and serves to exemplify, the more generally described process set forth above. The examples are presented for illustrative purposes only, and are not intended as a restriction on the scope of the invention.

EXAMPLE 1

1. Emulsion components.

polymer precursor—Dow Corning Sylgard 182 (siloxane oligomer with curing agent)

surfactant—dimethylsiloxane ethylene oxide block copolymer (ES224 by Silicon Resources Inc.)

catalyst—dicyclopentadiene - $PtCl_2$ complex

Several emulsions were obtained by mixing polymer precursor, water, the surfactant, the curing agent and the catalyst, in the given order. The amount of surfactant was varied in each emulsion from 5 to 20% of water mass. The mass ratio of precursor to curing agent was 10 to 1. The two phase system was stirred at high speed with an overhead stirrer equipped with a fan shaped stirrer blade. The homogeneous emulsion was achieved after about 5 minutes of stirring and then degassed in a vacuum oven until no more bubbles were observed. The samples were oven cured at approximately 70° C. for about 4 hours, in sealed disposable flasks. The water was then exchanged with acetone using Sohxlet extractor. The extraction time was one hour at a temperature of 85° C.

The samples were placed in a pressure chamber whose pressure was raised to 60 atm. The temperature was raised to 250° C. at a rate of 5° C./min and at constant pressure. The pressure was then reduced at a constant temperature at a rate of 2 atm/min. On reaching the ambient pressure, the temperature was reduced at a rate of 5° C./min. At 200° C. the system was purged with air, and allowed to continue cooling to ambient to form the foamed polysiloxane product. The mean pore sizes of the foam polysiloxane samples varied from 200 nm to 5 microns, depending on the amount of surfactant used.

EXAMPLE 2

A poly(amic acid) network has been formed in the presence of a high boiling point solvent, which plasticizes the system sufficiently for full network formation below the degradation temperature. Imidization has been induced thermally during the drying step. A supercritical solvent has been employed to remove the reaction solvent in order to avoid collapse of the structure due to capillary stress. The resulting foam has a density equals 0.18 g/cc and SEM reveals pores with diameters equal about 80 nm.

Although this invention has been described with respect to specific embodiments, the details thereof are not to be construed as limitations for it will be apparent that various embodiments, changes, and modifications may be resorted to without departing from the spirit and scope thereof, and it is understood that such equivalent embodiments are intended to be included within the scope of this invention.

We claim:

1. A process for forming a foamed polyimide comprising the steps of:

(a) forming an emulsion of liquid droplets dispersed in a continuous liquid phase of polyimide precursor;

(b) polymerizing the polyimide precursor to form a polyimide having dispersed pores filled with the liquid; and (c) heating the polyimide under pressure with a gas to a temperature above about 15° C. below the critical temperature of the liquid and a pressure above about 1 atmosphere below the critical pressure of the liquid to exchange the liquid in the pores with the gas.

2. The process of claim 1 wherein the temperature is at or above the critical temperature of the liquid and the pressure is at or above the critical pressure of the liquid.

3. The process of claim 2 wherein the liquid is an alcohol or ketone.

4. A process for forming a foamed polyimide comprising the steps of:

(a) forming an emulsion of polar liquid droplets dispersed in a continuous liquid phase of polyimide precursor;

(b) polymerizing the polyimide precursor to form a polyimide having dispersed pores filled with the polar liquid;

(c) contacting the polyimide with an organic liquid to exchange the polar liquid in the pores with organic liquid; and (d) heating the polyimide under pressure with a gas to a temperature above about 15° C. below the critical temperature of the organic liquid and a pressure above about 1 atmosphere below the critical pressure of the organic liquid to exchange the organic liquid in the pores with the gas.

5. The process of claim 4 wherein the temperature is at or above the critical temperature of the organic liquid and the pressure is at or above the critical pressure of the organic liquid.

6. The process of claim 5 wherein the organic liquid is a ketone.

7. The process of claim 6 wherein the organic liquid is acetone.

8. The process of claim 7 wherein the foamed polyimide has pore size of about 1 to about 8 microns.

* * * * *